(12) United States Patent
Christoph

(10) Patent No.: US 11,264,046 B2
(45) Date of Patent: Mar. 1, 2022

(54) SPEECH SIGNAL LEVELING

(71) Applicant: Harman Becker Automotive Systems GmbH, Karlsbad (DE)

(72) Inventor: Markus E Christoph, Straubing (DE)

(73) Assignee: Harman Becker Automotive Systems GmbH

( * ) Notice: Subject to any disclaimer, the term of this patent is extended or adjusted under 35 U.S.C. 154(b) by 74 days.

(21) Appl. No.: 16/631,151

(22) PCT Filed: Jul. 17, 2018

(86) PCT No.: PCT/EP2018/069374
§ 371 (c)(1),
(2) Date: Jan. 14, 2020

(87) PCT Pub. No.: WO2019/016199
PCT Pub. Date: Jan. 24, 2019

(65) Prior Publication Data
US 2020/0227065 A1  Jul. 16, 2020

(30) Foreign Application Priority Data

Jul. 18, 2017 (EP) .................................. 17181799

(51) Int. Cl.
*G10L 15/20* (2006.01)
*G10L 21/0364* (2013.01)
(Continued)

(52) U.S. Cl.
CPC .......... *G10L 21/0364* (2013.01); *G10L 15/20* (2013.01); *G10L 15/22* (2013.01);
(Continued)

(58) Field of Classification Search
CPC ..... G10L 21/0364; G10L 15/20; G10L 15/22; G10L 25/51; G10L 25/84; G10L 25/87
(Continued)

(56) References Cited

U.S. PATENT DOCUMENTS 6,154,548 A * 11/2000 Bizzan .................. H03G 3/348
                                                     381/94.5
7,013,011 B1 * 3/2006 Weeks .................. H03G 9/005
                                                     381/107
(Continued)

OTHER PUBLICATIONS

G. Hellwarth and G. Jones, "Automatic conditioning of speech signals," in IEEE Transactions on Audio and Electroacoustics, vol. 16 No. 2, pp. 169-179, Jun. 1968, doi: 10.1109/TAU.1968.1161969. (Year: 1968).*

*Primary Examiner* — Bharatkumar S Shah
(74) *Attorney, Agent, or Firm* — Angela M. Brunetti

(57) ABSTRACT

A speech signal leveling system and method include generating an output signal by applying a frequency-dependent or frequency-independent controllable gain to an input signal, the gain being dependent on a gain control signal, and generating at least one speech detection signal indicative of voice components contained in the input signal. The system and method further include generating the gain control signal based on the input signal and the at least one speech detection signal, controlling the controllable-gain block to amplify or attenuate the input signal to have a predetermined mean or maximum or absolute peak signal level as long as voice components are detected in the input signal.

17 Claims, 9 Drawing Sheets

(51) Int. Cl.
    *G10L 15/22*     (2006.01)
    *G10L 25/51*     (2013.01)
    *G10L 25/84*     (2013.01)
    *G10L 25/87*     (2013.01)
    *H03G 3/30*     (2006.01)
    *G10L 25/78*     (2013.01)

(52) U.S. Cl.
    CPC .............. *G10L 25/51* (2013.01); *G10L 25/84* (2013.01); *G10L 25/87* (2013.01); *H03G 3/3005* (2013.01); *G10L 25/78* (2013.01)

(58) Field of Classification Search
    USPC ........................................................ 704/233
    See application file for complete search history.

(56) References Cited

U.S. PATENT DOCUMENTS

| | | | |
|---|---|---|---|
| 2002/0012405 A1* | 1/2002 | Lee | H03D 1/02 375/300 |
| 2010/0208918 A1 | 8/2010 | Noguchi | |
| 2010/0324891 A1* | 12/2010 | Cutler | G10L 25/78 704/210 |
| 2012/0294437 A1* | 11/2012 | Haddad | H03G 3/3089 379/406.05 |
| 2013/0144615 A1 | 6/2013 | Rauhala | |
| 2013/0329912 A1 | 12/2013 | Krishnaswamy et al. | |
| 2016/0260443 A1 | 9/2016 | Wang | |

\* cited by examiner

SPEECH SIGNAL LEVELING

BACKGROUND

1. Technical Field

The disclosure relates to a system and method (generally referred to as a "system") for speech signal leveling.

2. Related Art

In speech signal processing such as speech recognition and hands-free communication, a well leveled output speech signal is crucial for an adequate recognition rate of a speech recognition system or an adequate intelligibility at a far-end side of a hands-free system. In a simple approach, an automatic gain control (AGC) may be based on a (peak) limiter whose (input) gain is set in such a way that speech, even when softly spoken or spoken from a far distance, is amplified to still deliver a well-leveled output signal, i.e. a speech signal whose peaks are ideally full scale of an acceptable maximum amplitude range. On the other hand, any speech spoken at closer distance with a loud voice is attenuated to full scale by the limiter. In this way, the signal-to-noise ratio (SNR) will decrease if the talker is at a shorter distance to an input microphone as the limiter will be more often active so that undesired noise and/or residual echoes are not limited in contrast to the speech which exceeds full scale and is limited to full scale by the (peak) limiter. If, however, a speaker is too far away from the microphone or speaks softly, the speech output signal will not be full scale, which again may decrease the SNR. As a consequence, a speech signal leveler is desired which automatically adjusts the speech level to such dynamically changing situations.

SUMMARY

A speech signal leveling system includes a controllable-gain block configured to receive an input signal and to generate an output signal by applying a frequency-dependent or frequency-independent controllable gain to the input signal, the gain being dependent on a gain control signal. The system further includes a speech detecting block configured to receive the input signal and to generate at least one speech detection signal indicative of voice components contained in the input signal. The system further includes a gain control block configured to receive the input signal and the at least one speech detection signal, and to generate the gain control signal based on the input signal and the at least one speech detection signal. The gain control block is further configured to control the controllable-gain block to amplify or attenuate the input signal to have a predetermined mean or maximum or absolute peak signal level as long as voice components are detected in the input signal.

A speech signal leveling method includes generating an output signal by applying a frequency-dependent or frequency-independent controllable gain to an input signal, the gain being dependent on a gain control signal, and generating at least one speech detection signal indicative of voice components contained in the input signal. The method further includes generating the gain control signal based on the input signal and the at least one speech detection signal, and controlling the controllable-gain block to amplify or attenuate the input signal to have a predetermined mean or maximum or absolute peak signal level as long as voice components are detected in the input signal.

Other systems, methods, features and advantages will be, or will become, apparent to one with skill in the art upon examination of the following detailed description and appended figures. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following description of exemplary speech leveling systems and methods, a block is understood to be a hardware system or an element thereof with at least one of: a processing unit (such as a controller, processor etc.) executing software and a dedicated circuit structure for implementing a desired signal transferring or processing function. Blocks may be connected to or in another way operatively coupled with each other to provide a specific signal flow structure and to generate specific signals as detailed below. A characteristic of speech (voice) is the presence of silent intervals (empty pauses) and vocalizations (filled pauses) that do not have a lexical meaning. An empty and a filled pause are likely to coincide with boundaries, realized as a silent interval of varying length, at clause and paragraph level and often mark the boundaries of narrative units. Pauses in speech are typically a multi-determined phenomenon attributable to physical, socio-psychological, communicative, linguistic and cognitive causes.

Figure 1:
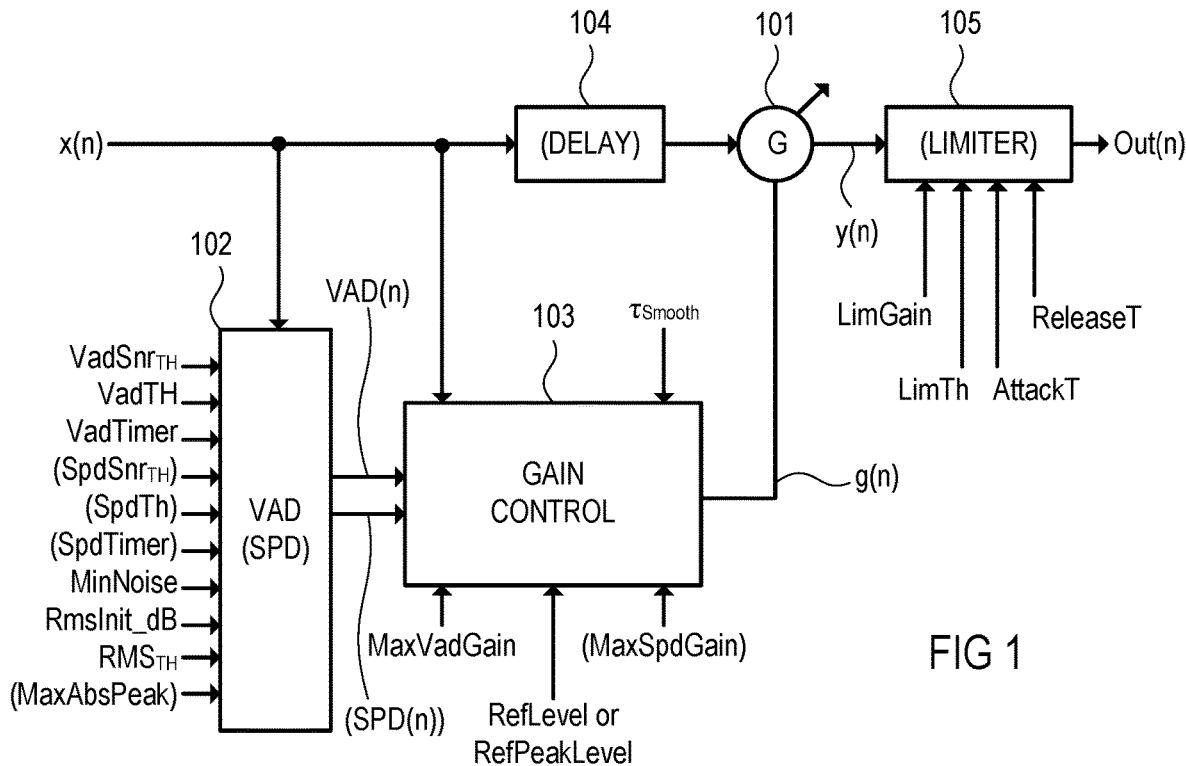
FIG. 1 is a simplified schematic diagram illustrating a signal processing structure and a signal flow of an exemplary speech leveling system.

FIG. 1 is a schematic diagram illustrating the signal processing structure and the signal flow of an exemplary speech leveling system (which may perform an exemplary speech leveling method). The speech leveling system shown in FIG. 1 includes a controllable-gain block 101 (e.g., a controllable amplifier, controllable attenuator, controllable filter, multiplier, etc.) that receives an input signal x(n) and provides an output signal y(n). The output signal y(n) is the input signal x(n) to which a frequency-dependent or frequency-independent controllable gain G has been applied. The controllable-gain block 101, i.e., its gain G, is controlled by way of a gain control signal g(n). The input signal x(n) is also supplied to a speech detecting block 102 that generates at least one speech detection signal indicative of voice components contained in the input signal x(n). In the example system shown, two speech detection signals, a voice activity detection signal VAD(n), e.g., a VAD flag, and a speech pause detection signal SPD(n), e.g., an SPD flag, are provided whose generation and characteristics are detailed further below.

The input signal x(n) is also supplied to a gain control block 103 which additionally receives the speech detection signals and generates the gain control signal g(n) based on the input signal x(n) and the speech detection signal(s), e.g., the voice activity detection signal VAD(n) and optionally the speech pause detection signal SPD(n). The gain control block 103 controls the controllable-gain block 101 so that the input signal x(n) is amplified or attenuated to have a predetermined mean or maximum or absolute peak signal level as long as no voice components are detected in the input signal x(n). For example, the input signal x(n) may be blocked, i.e., the output signal y(n) is (almost) zero, as long as no voice components are detected in the input signal x(n).

The speech leveling system shown in FIG. 1 may further include an optional delay block 104 that delays by a certain time (e.g., a certain number of frames or samples) the input signal x(n) before it is supplied to the controllable-gain block 101 such that the input signal x(n) supplied to the controllable-gain block 101 is delayed with respect to the input signal x(n) as it is supplied to the speech detecting block 102 and the gain control block 103. Situations in which the delay block 104 may be utilized are outlined further below.

The speech detecting block 102 may further receive, e.g., from a register or memory (both not shown), an SNR threshold VadSnr$_{TH}$, a threshold Vad$_{TH}$, and, a timer value Vad$_{Timer}$, for the voice activity detection, and, optionally, a SNR threshold SpdSnr$_{TH}$, a threshold Spd$_{TH}$, and a timer value SpdTimer for the optional speech pause detection. Further, at least one of a minimum noise threshold MinNoise, an initial root mean square (RMS) value RmsInit_dB, a root mean square threshold RMS$_{TH}$, and a threshold MaxAbsPeak may be provided to the speech detecting block 102. The gain control block 103 may further receive, e.g., from a register or memory (both not shown), an optional smoothing time parameter $\tau_{Smooth}$, at least one of tuning parameter MaxVadGain and tuning parameter MaxSpdGain, and a reference level RefLevel or a reference peak level RefPeakLevel. Optionally, a (peak) limiter block 105 may operatively be connected downstream of the controllable-gain block 101 to receive the output signal y(n) and to provide a limited output signal Out(n). The (peak) limiter block 105 may further receive a predetermined limiter gain LimGain, a limiter threshold LimTh, an attack time AttackT, and a release time ReleaseT.

Figure 2:
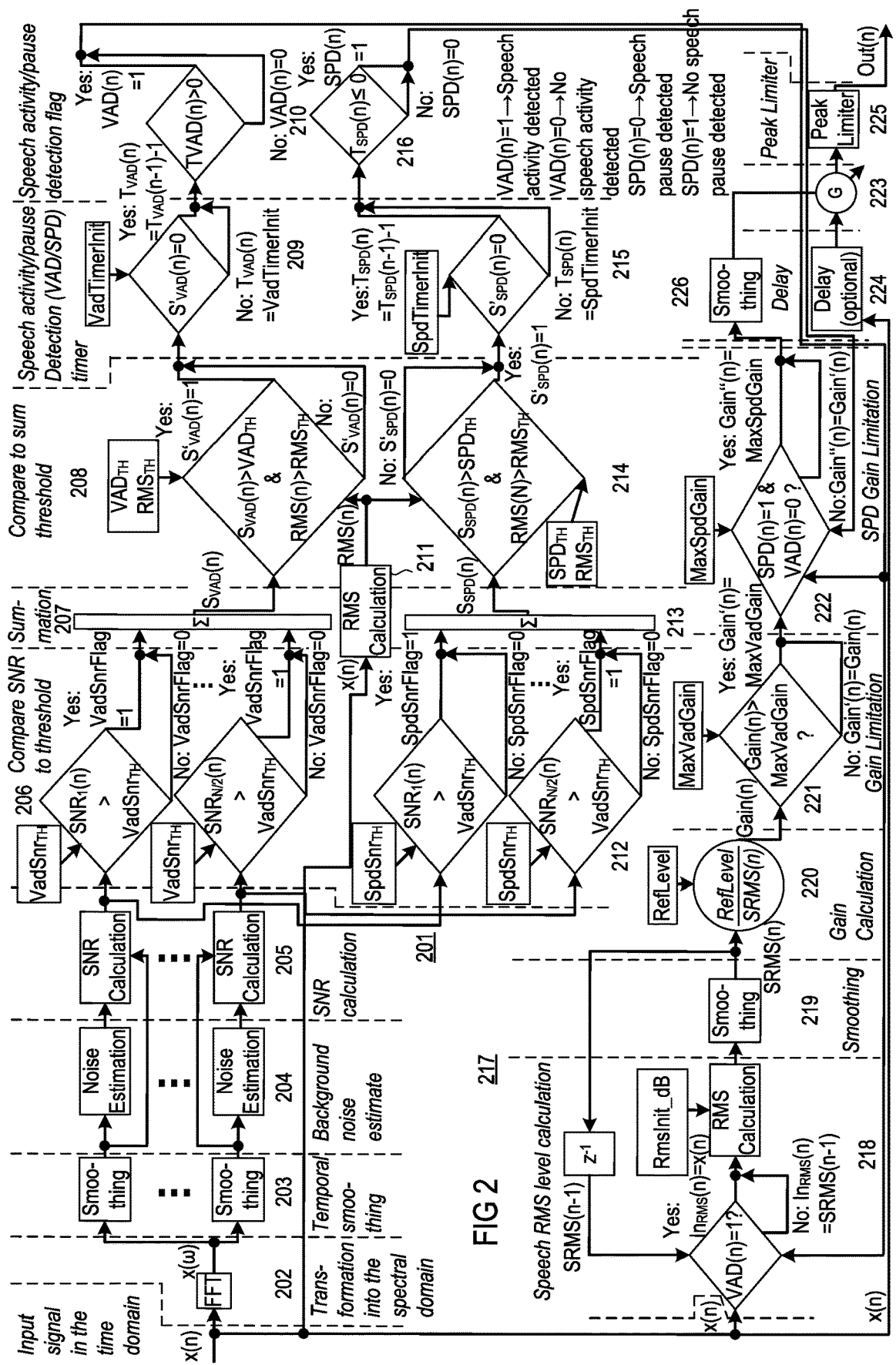
FIG. 2 is a detailed schematic diagram illustrating a signal processing structure and signal flow of an exemplary implementation of the speech leveling system shown in FIG. 1.

FIG. 2 is a schematic diagram illustrating the signal processing structure and the signal flow of another exemplary speech leveling system (which performs another exemplary speech leveling method). In the speech leveling system shown in FIG. 2, a speech detector block 201 may include transforming the input signal x(n) from the time domain into the frequency domain, which may be performed by a time-frequency transformation block 202. The spectral components of the input signal x(n) can be obtained by a variety of ways, including band pass filtering and Fourier transformation. In one approach, a Discrete Fourier Transform (DFT) or Fast Fourier Transform (FFT) may be used to transform sequential blocks of N points of the input signal. A window function, such as a Hanning window, may be applied, in which case an overlap of N/2 points can be used. The DFT can be used at each frequency bin in the input signal. Alternatively, the FFT can be used over the whole frequency band occupied by the input signal. The spectrum is stored for each frequency bin within the input signal band.

In the present example, time-frequency transformation block 202 applies an FFT with optional windowing (not shown) to the input signal x(n) in the time domain to generate a signal X($\Omega$) in the frequency domain. The signal X($\Omega$) may be optionally smoothed utilizing, e.g., a moving average filter of appropriate length.

The (optional) spectral smoothing may account for a plurality of frequency bins, which reduces the spectral resolution. The output of the time-frequency transformation block 202 is further smoothed by a multiplicity (M) of temporal smoothing blocks 203 that are operatively connected downstream of the time-frequency transformation block 202. The multiplicity of temporal smoothing blocks 203 combines frequency bin values over time to reduce the temporal dynamics in the output signal of time-frequency transformation block 202.

The multiplicity of temporal smoothing blocks 203 outputs temporal smoothed signals that may still contain impulsive distortions as well as background noise. A multiplicity (M) of noise estimation blocks 204 is operatively connected downstream of the multiplicity of temporal smoothing blocks 203 to smear out impulsive distortions such as speech in the outputs of the multiplicity of temporal smoothing blocks 203 and to estimate the current background noise. In order to reduce or avoid smearing of a desired signal such as music or voice signals, non-linear smoothing (not shown) may be employed in the multiplicity of noise estimation blocks 204.

Based on the smoothed signals from the multiplicity of temporal smoothing blocks 203 and the estimated quasi stationary background noise signals from the multiplicity of noise estimation blocks 204, the variations in the SNR can be determined (calculated), e.g., as frequency distribution of SNR values. Using variations in the SNR, noise can be differentiated from a desired speech or music signal. For example, a low SNR value may be linked to a variety of noise sources such as an air-conditioner, fan, an open window, or an electrical device such as a computer etc. The SNR may be evaluated in the time domain or in the frequency domain or in the sub-band domain.

In a multiplicity (M) of comparator blocks 206, output SNR values determined by the multiplicity (M) of SNR determination blocks 205 are compared to a pre-determined threshold, e.g., an SNR threshold VadSnr$_{TH}$. If the determined current SNR values are greater than the pre-determined threshold VadSnr$_{TH}$, flags VadSnrFlag will be set to a first logic value, e.g., '1'. Otherwise, the flags VadSnrFlag will be set to a second logic value, e.g., '0'. The flags from the multiplicity of comparator blocks 206 are passed on to a summation block 207. The summation block 207 sums up the spectral flags VadSnrFlag from the multiplicity of comparator blocks 206 and outputs a time varying sum signal S$_{VAD}$(n). Further, an RMS determination block 211 may provide a mean signal RMS(n) indicative of the (root mean square) mean of the input signal x(n). The sum signal S$_{VAD}$(n) and the mean signal RMS(n) are passed to a comparator block 208 where the sum signal S$_{VAD}$(n) is compared to a pre-determined sum threshold $VAD_{TH}$, and the mean signal RMS(n) is compared to a pre-determined threshold $RMS_{TH}$. If the current value of the sum signal $S_{VAD}(n)$ is greater than the pre-determined sum threshold $VAD_{TH}$, and the mean signal RMS(n) is greater than the pre-determined threshold $RMS_{TH}$, a flag $S'_{VAD}(n)$, which can be considered an updated sum signal $S_{VAD}(n)$, will be set to a first logic state, e.g., '1' (one). Otherwise the flag $S'_{VAD}(n)$ will be set to another logical state, e.g., '0' (zero). Instead of the RMS determination block 211, a maximum absolute peak determination block (not shown) that is configured to determine a maximum absolute peak value of the input signal x(n) may be used to subsequently compare the maximum absolute peak value to a maximum absolute peak threshold.

The output signal of the comparator block 208, i.e., flag $S'_{VAD}(n)$, is passed to a voice activity detection (VAD) timer block 209 that detects whether flag $S'_{VAD}(n)$ is '0' or not. At a time n, if the flag $S_{VAD}(n)$ is '0', the VAD timer block 209 sets a count $T_{VAD}(n)$ to $T_{VAD}(n-1)-1$, i.e., decrements the previous count $T_{VAD}(n-1)$ by one. If the flag $S_{VAD}(n)$ is not '0', i.e., is '1', the count $T_{VAD}(n)$ will be reset to an initialization value VadTimerinit. The output of the VAD timer block 209, i.e., count $T_{VAD}(n)$, is passed on to a voice activity detection (VAD) block 210 where the count $T_{VAD}(n)$ is compared with a pre-determined threshold, e.g., zero. If the current count $T_{VAD}(n)$ is greater than the pre-determined threshold (zero), a flag VAD(n) will be set to '1', otherwise to '0'.

Additionally or alternatively, in a multiplicity (M) of comparator blocks 212, the SNR values determined by the multiplicity (M) of SNR determination blocks 205 are compared with a pre-determined threshold, e.g., an SNR threshold $SpdSnr_{TH}$. If the determined current SNR values are greater than the pre-determined threshold $SpdSnr_{TH}$, flags SpdSnrFlag will be set to, e.g., '1'. Otherwise, the flags SpdSnrFlag will be set to '0'. The flags from the multiplicity of comparator blocks 212 are passed on to a summation block 213. The summation block 213 sums up the flags SpdSnrFlag from the multiplicity of comparator blocks 212 and outputs a time varying sum signal $S_{SPD}(n)$. The sum signal $S_{SPD}(n)$ and the mean signal RMS(n) from RMS determination block 211 are passed to a comparator block 214 where the sum signal $S_{SPD}(n)$ is compared to a pre-determined sum threshold $SPD_{TH}$, and the mean signal RMS(n) is compared to a pre-determined threshold $RMS_{TH}$. If the current value of the sum signal $S_{SPD}(n)$ is greater than the pre-determined sum threshold $SPD_{TH}$, and the mean signal RMS(n) is greater than the pre-determined threshold $RMS_{TH}$, a flag $S'_{SPD}(n)$, which can be considered as updated sum signal $S'_{SPD}(n)$, will be set to, e.g., '1'. Otherwise the flag $S'_{SPD}(n)$ will be set to '0'.

The output signal of the comparator block 214, i.e., flag $S'_{SPD}(n)$, is passed to a speech pause detection (SPD) timer block 215 that detects whether flag $S'_{SPD}(n)$ is '0' or not. At a time n, if the flag $S'_{SPD}(n)$ is '0', the SPD timer block 215 sets a count $T_{SPD}(n)$ to $T_{SPD}(n-1)-1$, i.e., decrements the previous count $T_{SPD}(n-1)$ by one. If the flag $S'_{SPD}(n)$ is not '0', i.e., is '1', the count $T_{SPD}(n)$ will be reset to an initialization value SpdTimerinit. The output of the SPD timer block 215, i.e., count $T_{SPD}(n)$, is passed on to a speech pause detection (SPD) block 216 where the count $T_{SPD}(n)$ is compared to a pre-determined threshold, e.g., zero. If the current count $T_{SPD}(n)$ is smaller or equal than the pre-determined threshold (zero), a flag SPD(n) will be set to '1', otherwise to '0'.

If flag VAD(n) is '1' at time n, voice activity is detected. If it is '0', no speech activity is detected. If flag SPD(n) is '1' at a time n, a speech pause is detected. If it is '0', no speech pause is detected. For example, initialization values VadTimerinit as utilized in VAD timer block 209 and SpdTimerinit as utilized in SPD timer block 215 may be different. SNR thresholds $VadSnr_{TH}$ as utilized in comparator block 206 and $SpdSnr_{TH}$ as utilized in comparator block 212 may have different values, for example. Sum thresholds $VAD_{TH}$ and $SPD_{TH}$ as utilized in comparator blocks 208 and 214 may be equal, for example.

In the speech leveling system shown in FIG. 2, a gain control block 217 includes a speech RMS level determination block 218 which receives the input signal x(n), the flag VAD(n) and a previous sample of smoothed RMS signal SRMS(n−1), and which outputs a signal $In_{RMS}(n)$. The signal $In_{RMS}(n)$ corresponds to the input signal x(n) if the flag VAD(n) is '1', and is set to the value of the previous sample of the smoothed RMS signal SRMS(n−1) otherwise. The signal $In_{RMS}(n)$ is subject to a subsequent RMS determination (calculation) optionally utilizing the initial root mean square (RMS) value RmsInit_dB. The value out of the RMS determination is supplied to a smoothing block 219 which provides a smoothed RMS signal SRMS(n). The smoothed RMS signal SRMS(n) is, on the one hand, delayed by one sample to generate the previous sample of the smoothed RMS signal SRMS(n−1) which is fed back to the speech RMS level determination block 218, and, on the other hand, is supplied to a gain determination block 220 where a gain control signal Gain(n) is generated according to the ratio between a reference level RefLevel and the smoothed RMS signal SRMS(n).

In an optional gain limitation block 221, the gain control signal Gain(n) is compared to a reference value MaxVadGain. As a consequence, if the gain control signal Gain(n) is greater than the reference value MaxVadGain, the output signal of the gain limitation block 221, limited gain control signal Gain'(n) which can be considered an updated gain control signal Gain(n), is set to the reference voice activity value MaxVadGain, and otherwise to the gain control signal Gain(n). In the present example, the limited gain control signal Gain'(n) is supplied to an SPD gain limitation block 222 which further receives the flags VAD(n) and SPD(n) as well as a reference speech pause value MaxSpdGain. If flag SPD(n) is '1' and flag VAD(n) is '0' at time n, a final gain control signal Gain"(n), which can be considered as updated gain control signal Gain'(n), is set to the reference speech pause value MaxSpdGain, and otherwise to the limited gain control signal Gain'(n). Alternatively, block 222 may receive only the SPD flag. The final gain control signal Gain"(n) may optionally be smoothed over time by way of a smoothing filter block 226 before it controls a controllable gain block 223 which is supplied via an optional delay block 224 with the input signal x(n) and which outputs via an optional peak limiter 225 the limited output signal Out(n).

In the system shown in FIG. 2, two different tuning sets are used for the determination of the voice activity detection flag VAD(n) and the optional speech pause detection flag SPD(n). However, both are based on the same spectral SNR values. As already mentioned above, for the determination of the voice activity detection flag VAD(n), a higher value for the SNR threshold $VadSnr_{TH}$ may be used than for the SNR threshold $SpdSnr_{TH}$ for the determination the speech pause detection flag SPD(n). This allows, on the one hand, to only set the voice activity detection flag VAD(n) if it is sure that speech is present, hence the application of a high threshold, and, on the other hand, to set the speech pause detection flag SPD(n) to '1' only if it is sure that a speech pause occurs. This may be achieved by setting the respective SNR threshold to a lower value such that even vague speech parts will result in a detected speech activity and, thus, avoid an erroneous setting of the speech pause detection flag SPD(n).

Further, the numbers of spectral lines that exceed the given signal-to-noise ratio thresholds $\text{VadSnr}_{TH}$ and $\text{SpdSnr}_{TH}$ are determined (counted) and these numbers are compared to the thresholds $\text{VAD}_{TH}$ for the voice activity detection part and $\text{SPD}_{TH}$ for the speech pause detection part. In parallel, also the RMS value of the input signal x(n), or a signal corresponding to the input signal x(n) such as the output signal y(n) is calculated per frame whose size may depend on the length of an involved FFT and a chosen overlap. For example, the FFT length may be 512 taps, at a sampling frequency fs of 16 kHz and the overlap may be set to 50%, which leads to a frame size of 256 samples. This means that after every block of samples (e.g., every 256th sample) the RMS value of the input signal x(n), or a signal corresponding to the input signal x(n) such as the output signal y(n), is calculated from all block samples (e.g., 256 previous samples) and then compared to the RMS threshold $\text{RMS}_{TH}$. Only if the current RMS value RMS(n) exceeds the threshold $\text{RMS}_{TH}$, a positive decision of a previous stage that compares the numbers of samples of spectral signal-to-noise ratios exceeding the thresholds $\text{VadSnr}_{TH}$ and $\text{SpdSnr}_{TH}$, will be accepted (or not). If the current RMS value RMS(n) does not exceed the RMS threshold $\text{RMS}_{TH}$, neither a positive voice activity nor a positive speech pause decision will be made and the current status will be maintained instead.

The RMS processing part serves to avoid erroneous settings of the detection flags for voice activity detection and speech pause detection in occasions where the signal-to-noise ratio is high but the level of the input signal is low. Since the signal-to-noise ratio is a relative value it is possible that high signal-to-noise ratios will occur, even if the level of the input signal is very low as, for example, in echo-only scenarios. In such a case, the level of the residual echo can be very low but its signal-to-noise ratio can still be high and as such could erroneously trigger the flag for voice activity detection VAD(n) and the flag for speech pause detection SPD(n) if taken as sole decision-maker. To avoid this, additionally at least one other absolute value may be employed before a final decision is made. One approach is to take the energy or the RMS value of the input signal x(n) or output signal y(n) into consideration. For example, the signal-to-noise ratio will only be considered if, e.g., the current RMS value exceeds a certain limit so that erroneous settings of the flag for voice activity detection VAD(n) and the flag for speech pause detection SPD(n) by very small input signals is avoided. In another approach, the minimum noise threshold MinNoise is set to a much higher value. Thus, very small input signals can be limited to this threshold and as a consequence the achievable signal-to-noise ratios will decrease in case of very small input signals.

In order to avoid that the gain rises to undesired high values, the residual echo may be amplified more or less to full scale and/or the gain may be limited to a maximum, e.g., by way of the optional tuning parameter MaxVadGain. Thereby, different timer values for voice activity detection and speech pause detection may be employed. Whereas the timer for the voice activity detection may be set to an average length of a word, the timer for the speech pause detection may be set to a higher value, to ensure that an utterance is securely finished before the time varying speech pause detection flag SPD(n) is set to '1'. In contrast, the time varying voice activity detection flag VAD(n) will be set to '0', if its initial timer value VadTimerinit has expired.

If the time varying VAD flag is set to '1', i.e. only in active speech sequences, the RMS value or, alternatively, the maximum absolute peak value of the input signal x(n) will be determined. Otherwise, the previous sample of the smoothed speech RMS value SRMS(n−1) will be passed on to the smoothing filter. In order to avoid undesired transient effects, RMS determination may optionally be initialized with a properly chosen initialization value RmsInit_dB. As a smoothing filter, for example, an Infinite Impulse Response (IIR) low-pass filter with a relatively long smoothing time constant τ, may be used. The current gain value Gain(n) is determined (calculated) by taking the ratio of the desired reference RMS value of the speech output signal, i.e., reference level RefLevel or alternatively reference peak level RefPeakLevel, and the output signal of this smoothing filter, i.e., SRMS(n), so that Gain(n)=RefLevel/SRMS(n).

Further, an optional limitation of the maximum of the gain value Gain(n) may be applied, in order to avoid successive amplifications of very small input signals, as already described above. Still another limitation of the gain value may optionally be applied, which may act as a level compensator in hands-free applications and which may be controlled by the time varying voice activity detection flag VAD(n) and/or the time varying speech pause detection flag SPD(n). Thereby the gain value Gain(n) will be reduced to the given limit MaxSpdGain whenever a speech pause and no voice activity is detected, e.g. whenever the speech pause detection flag SPD(n) assumes '1' and the time varying voice activity detection flag VAD(n) assumes '0'. For example, no gain or even gain reduction will be applied to the input signal x(n), if SPD(n)='1' and VAD(n)='0'.

The procedure outlined above, which can also be considered as "gating of the gain value", allows, e.g., to fulfill the requirements for a Terminal Coupling Loss weighted (TCLw) value in hands-free mode so that it is possible to meet the given requirement for a TCLw value of e.g. >−52 dB, as the measurement of the TCLw value requires that this value has to be reached between an input signal, which is taken by a reference microphone in proximity to the microphones installed at the device and the final, electrical output signal of the device, while the device is playing at a defined playback volume, to reach a sound pressure level of L≈−76 dBSPL(A) in a distance of d=1 m from speaker(s) of the device. In hands-free mode it is also specified to deliver a minimum output speech RMS signal of about −24 dBFS, just as is the case in speech recognition mode. Without the before mentioned gating functionality of the gain determination unit, these somewhat contradicting requirements can be hardly fulfilled.

With the described system it is possible to securely sense speech pauses and as such to apply the needed gating to the gain value Gain(n). A major challenge is to leave this gating stage quick enough once speech (from the near end talker) is active again. If this is not guaranteed, it may happen that the first parts of the on-setting speech may not be amplified as desired and as such cannot be understood, neither by speech recognition systems, nor by a human listener (far-end talker). One way to avoid this is to use a quickly reacting voice activity detection and/or speech pause detection. This can be realized by using a non-smoothed, instantaneous RMS value which will be compared to the given threshold as part of the decision. If this is not sufficient, the input signal can optionally be delayed by one or several frames, before the current gain Gain(n) is applied to it. This can be done as long as the maximally given latency is not exceeded.

Figure 3:
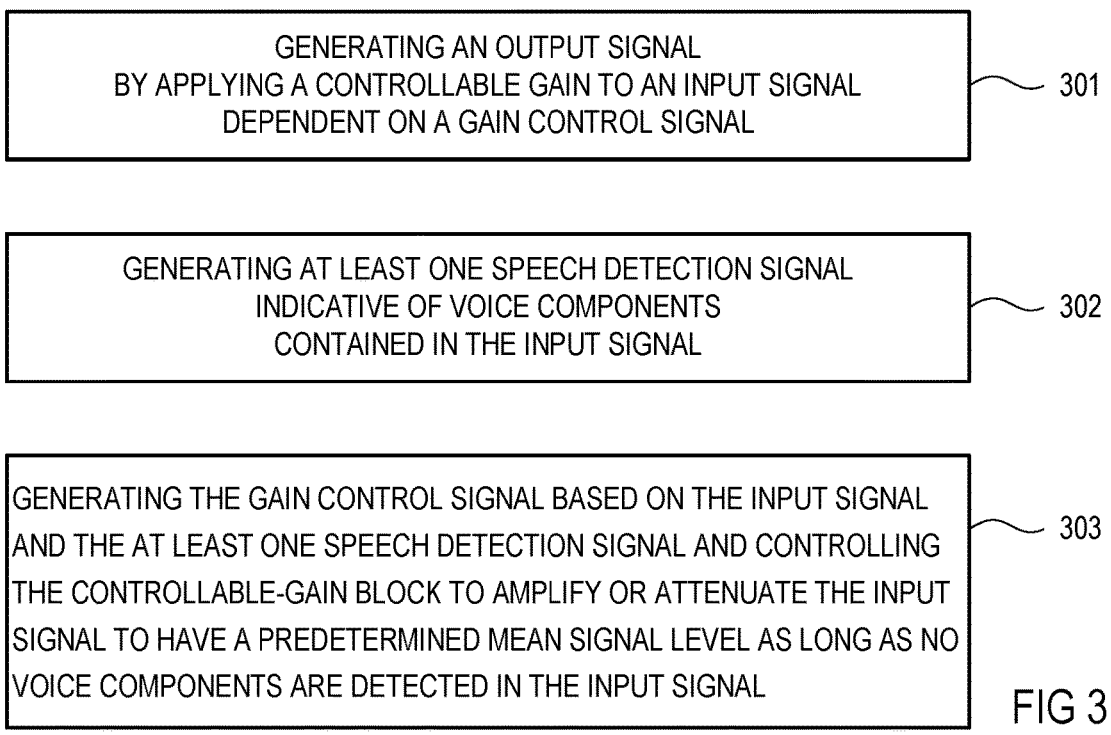
FIG. 3 is a flow chart illustrating an exemplary speech leveling method.

FIG. 3 is a flow chart illustrating an exemplary speech leveling method. The method includes a procedure 301 in which an output signal is generated by applying a frequency-dependent or frequency-independent controllable gain to an input signal, the gain being dependent on a gain control signal. In a procedure 302, at least one speech detection signal indicative of voice components contained in the input signal is generated. The method further includes a procedure 303 in which the gain control signal is generated based on the input signal and the at least one speech detection signal and the controllable-gain block is controlled to amplify or attenuate the input signal to have a predetermined mean signal level as long as no voice components are detected in the input signal, e.g., to block the input signal so that no output signal is provided as long as no voice components are detected in the input signal.

Figure 4:
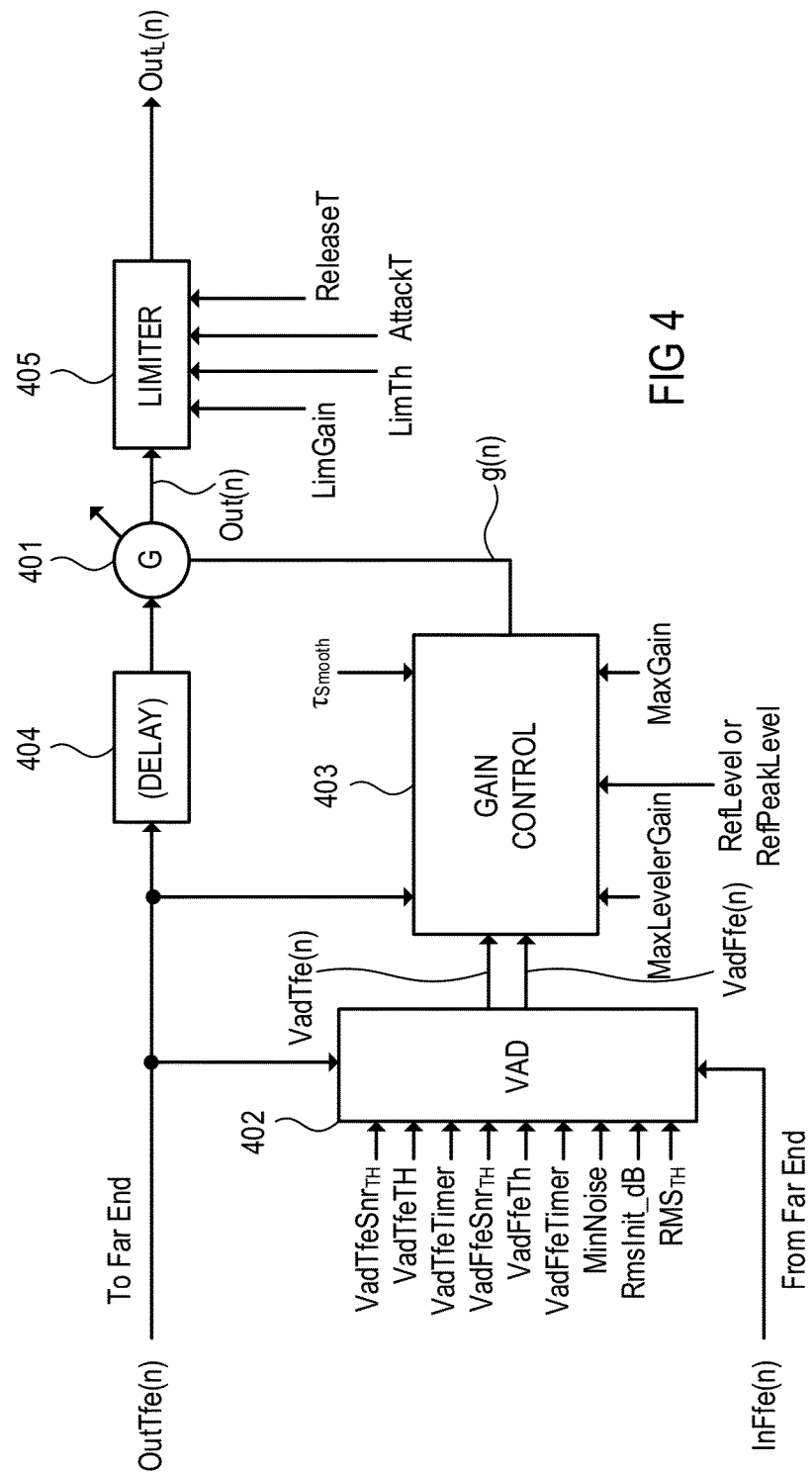
FIG. 4 is a simplified schematic diagram illustrating a signal processing structure and signal flow of another exemplary speech leveling system.

FIG. 4 is a simplified schematic diagram illustrating a signal processing structure and signal flow of another exemplary speech leveling system. The system shown in FIG. 4 includes a controllable-gain block 401 (e.g., a controllable amplifier, controllable attenuator, controllable filter, multiplier, etc.) that receives, as an input signal, an output signal OutTfe(n) sent to a far end and provides an output signal Out(n). The output signal Out (n) is here the output signal OutTfe(n) to which a frequency-dependent or frequency-independent controllable gain G has been applied. The controllable-gain block 401, i.e., its gain G, is controlled by way of a gain control signal g(n). The output signal OutTfe(n) is also supplied to a speech detecting block 402 that generates at least one speech detection signal indicative of voice components contained in the output signal OutTfe(n). In the example system shown, two speech detection signals, a first voice activity detection signal VadTfe(n), e.g., a first VAD flag, and a second voice activity detection signal VadFfe(n), e.g., a second VAD flag, are provided whose generation and characteristics are detailed further below.

The output signal OutTfe(n) is also supplied to a gain control block 403 which additionally receives the speech detection signals and generates the gain control signal g(n) based on the output signal OutTfe(n) and the speech detection signal(s), the first voice activity detection signal VadTfe(n) and the second voice activity detection signal VadFfe(n). The gain control block 403 controls the controllable-gain block 401 so that the output signal OutTfe(n) is, amplified or attenuated to have a predetermined mean or maximum or absolute peak signal level as long as no voice components are detected in the output signal OutTfe(n). For example, the output signal OutTfe(n) may be blocked, i.e., the output signal Out(n) is (almost) zero, as long as no voice components are detected in the output signal OutTfe(n).

The speech leveling system shown in FIG. 4 may further include an optional delay block 404 that delays by a certain time (e.g., a certain number of frames or samples) the input signal x(n) before it is supplied to the controllable-gain block 401 such that the input signal x(n) supplied to the controllable-gain block 401 is delayed with respect to the input signal x(n) as it is supplied to the speech detecting block 402 and the gain control block 403. Situations in which the delay block 404 may be utilized are outlined further below.

The speech detecting block 402 is further connected to receive, e.g., from a register or memory (both not shown), an SNR threshold VadTfeSnr$_{TH}$, a threshold VadTfe$_{TH}$, and a timer value VadTfeTimer, for the first voice activity detection based on the output signal OutTfe(n), and an SNR threshold VadFfeSnr$_{TH}$, a threshold VadFfe$_{TH}$, and, a timer value VadFfeTimer, for the second voice activity detection based on an input signal InFfe(n) from the far end. For that reason, the input signal InFfe(n) is supplied to speech detecting block 402. Further, at least one of a minimum noise threshold MinNoise, an initial root mean square (RMS) value RmsInit_dB, and a root mean square threshold RMS$_{TH}$, may be provided to the speech detecting block 402.

The gain control block 403 may further receive, e.g., from a register or memory (both not shown), an optional smoothing time parameter $\tau_{Smooth}$, at least one of a maximum gain tuning parameter MaxGain and maximum levelling gain tuning parameter MaxLevelerGain, and a reference level RefLevel or a reference peak level RefPeakLevel. Optionally, a (peak) limiter block 405 may operatively be connected downstream of the controllable-gain block 401 to receive the output signal Out(n) and to provide a limited output signal Out$_L$(n). The (peak) limiter block 405 may further receive signals representing a predetermined limiter gain LimGain, a limiter threshold LimTh, an attack time AttackT, and a release time ReleaseT.

Figure 5A:
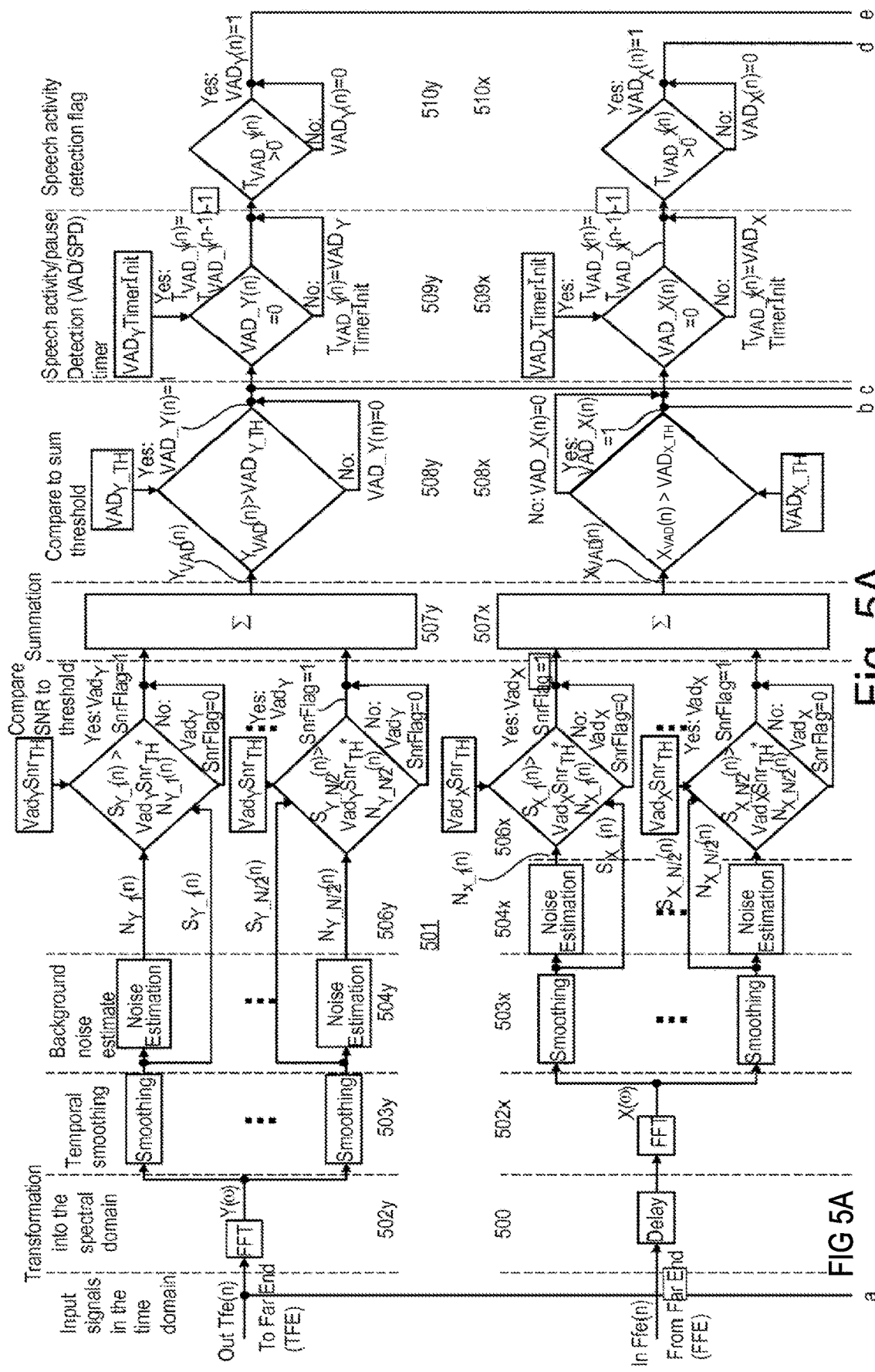
FIGS. 5A and 5B are detailed schematic diagrams illustrating a signal processing structure and signal flow of an exemplary implementation of the speech leveling system shown in FIG. 4.
Figure 5B:
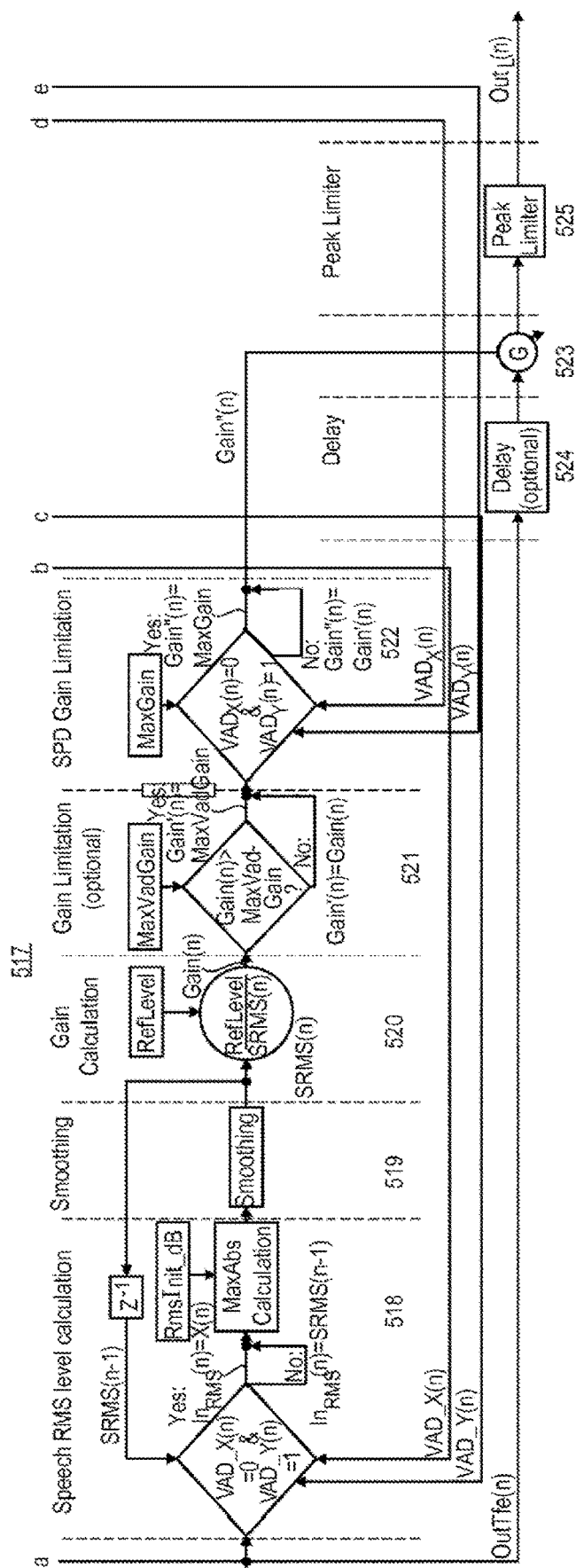

FIGS. 5A and 5B are detailed schematic diagrams illustrating an exemplary implementation of the speech leveling system shown in FIG. 4. In the speech leveling system as partially shown in FIG. 5A, a voice activity detector block 501 may be configured to transform by way of a time-frequency transformation block 502y the input signal in the time domain, which is the output signal OutTfe(n), into a signal in the frequency domain, e.g., a group of discrete spectral components Y($\omega$). The spectral components Y($\omega$) of the output signal OutTfe(n) can be obtained by a variety of ways, including band pass filtering and Fourier transformation. In one approach, a Discrete Fourier Transform (DFT) or Fast Fourier Transform (FFT) may be used to transform sequential blocks of N points of the input signal. A window function, such as a Hanning window, may be applied, in which case an overlap of a multiplicity of, e.g., N/2 points can be used. The DFT can be used at each frequency bin in the input signal. Alternatively, the FFT can be used over the whole frequency band occupied by the input signal. The spectrum is stored for each frequency bin within the signal band of the output signal Out(n). Similarly, a time-frequency transformation block 502x applies an FFT with optional windowing (not shown) also to the input signal InFfe(n) in the time domain, after being delayed by delay block 500, in order to generate therefrom a signal in the frequency domain, e.g., a group of spectral components X($\omega$). The spectral components X($\omega$) and Y($\omega$) are herein also referred to just as signals X($\omega$) and Y($\omega$).

The signals X($\omega$) may be each optionally smoothed by a group of (e.g., (N/2) temporal smoothing blocks 503y and the signals Y($\omega$) may be each optionally smoothed by a group of (e.g., (N/2) temporal smoothing blocks 503x, each block utilizing, e.g., a moving average filter of appropriate length. An (optional) spectral smoothing may account for a plurality of frequency bins, which reduces the spectral resolution. The temporal smoothing blocks 503y and 503x are operatively connected downstream of the time-frequency transformation blocks 502y and 502x, respectively. The groups of temporal smoothing blocks 503y and 503x combine frequency bin values over time for each of signals Y($\omega$) and X($\omega$), respectively, to reduce the temporal dynamics in the output signal of the time-frequency transformation blocks 502y and 502x.

The groups of temporal smoothing blocks 503y and 503x output temporal smoothed signals that may still contain impulsive distortions as well as background noise. Each of the (e.g., N/2) noise estimation blocks 504y and (e.g., N/2) noise estimation blocks 504x is operatively connected downstream of a corresponding one of the multiplicity of temporal smoothing blocks 503y and 503x to smear out impulsive distortions such as speech in the outputs of the temporal smoothing blocks 503y and 503x, and to provide groups of smoothed signals $S_{Y\_1}(n) \ldots S_{Y\_N/2}(n)$ and smoothed signals $S_{X\_1}(n) \ldots S_{X\_N/2}(n)$ that form basis for estimating the respective current background noise. The group of smoothed signals $S_{Y\_1}(n) \ldots S_{Y\_N/2}(n)$ relates to the signals $Y(\omega)$ and the other group of smoothed signals $S_{X\_1}(n) \ldots S_{X\_N/2}(n)$ relates to the signals $X(\omega)$. In order to reduce or avoid smearing of a desired signal such as music or voice signals, non-linear smoothing (not shown) may be employed in the multiplicity of noise estimation blocks 504y and 504x. A group of background noise estimates $N_{Y\_1}(n) \ldots N_{Y\_N/2}(n)$ is determined by one group of the noise estimation blocks 504y and a group of background noise estimates $N_{X\_1}(n) \ldots N_{X\_N/2}(n)$ is determined by the other group of noise estimation blocks 504x.

In a multiplicity of comparator blocks 506y and 506x, the one group of smoothed signals SY_1(n) ... SY_N/2(n) is compared to a pre-determined threshold, e.g., an SNR threshold VadYSnrTH, multiplied with the group of background noise estimates NY_1(n) ... NY_N/2(n), and the other group of smoothed signals SX_1(n) ... SX_N/2(n) is compared to another pre-determined threshold, e.g., an SNR threshold VadXSnrTH, multiplied with the group of background noise estimates NX_1(n) ... NX_N/2(n). The group of smoothed signals SY_1(n) ... SY_N/2(n) and the group of background noise estimates NY_1(n) ... NY_N/2(n) relate to the signals $Y(\omega)$, and the other group of smoothed signals SX_1(n) ... SX_N/2(n) and the other group of background noise estimates NX_1(n) ... NX_N/2(n) relate to the signals $X(\omega)$. If current SNR values determined from smoothed signals SY_1(n) ... SY_N/2(n) and SX_1(n) ... SX_N/2(n) and background noise estimates NX_1(n) ... NX_N/2(n) are each greater than corresponding pre-determined thresholds VadYSnrTH and VadXSnrTH, respectively, corresponding flags VadYSnrFlag and VadXSnrFlag, will be set to a first logic value, e.g., '1'. Otherwise, the flags VadYSnrFlag and VadXSnrFlag will be set to a second logic value, e.g., '0'. The flags from each group of the multiplicity of comparator blocks 506y and 506x are passed on to a corresponding group summation block 507y and 507x, respectively. The summation block 507y sums up the spectral flags VadYSnrFlag from the multiplicity of comparator blocks 506y and outputs a time varying sum signal YVAD(n). The summation block 507x sums up the spectral flags VadXSnrFlag from the multiplicity of comparator blocks 506y and 506x and outputs a time varying sum signal XVAD(n).

The sum signals $Y_{VAD}(n)$ and $X_{VAD}(n)$ are passed on to comparator blocks 508y and 508x where the sum signal $Y_{VAD}(n)$ is compared to a pre-determined sum threshold $VAD_{Y\_TH}$ and the sum signal $X_{VAD}(n)$ is compared to a pre-determined sum threshold $VAD_{X\_TH}$. If the current value of the sum signal $Y_{VAD}(n)$ is greater than the pre-determined sum threshold $VAD_{Y\_TH}$, a flag VAD_Y(n), which can be considered an updated sum signal $Y_{VAD}(n)$, will be set to a first logic state, e.g., '1' (one). Otherwise the flag VAD_Y(n) will be set to another logical state, e.g., '0' (zero). If the current value of the sum signal $X_{VAD}(n)$ is greater than the pre-determined sum threshold $VAD_{X\_TH}$, a flag VAD_X(n), which can be considered an updated sum signal $X_{VAD}(n)$, will be set to a first logic state, e.g., '1' (one). Otherwise the flag VAD_X(n) will be set to another logical state, e.g., '0' (zero).

Output signals of comparator blocks 508y and 508x, i.e., flags VAD_Y(n) and VAD_X(n), are passed on to voice activity/pause detection (VAD/SPD) timer blocks 509y and 509x that detect whether flags VAD_Y(n) and VAD_X(n) are '0' or not. At a time n, if the flag VAD_Y(n) is '0', the VAD timer block 509y sets a count TVAD_Y(n) to TVAD_Y(n−1)−1, i.e., decrements the previous count TVAD_Y(n−1) by one. If not, the count TVAD_Y(n) will be reset to an initialization value VadYTimerInit. The output of the VAD timer block 509y, i.e., count TVAD_Y(n), is passed on to a voice activity detection (VAD) block 510y where the count TVAD_Y(n) is compared with a pre-determined threshold, e.g., zero. If the current count TVAD_Y(n) is greater than the pre-determined threshold (zero), a flag VADY(n) will be set to '1', otherwise to '0'. Similarly, if the flag VAD_X(n) is '0', the VAD timer block 509x sets a count TVAD_X(n) to TVAD_X(n−1)−1, i.e., decrements the previous count TVAD_X(n−1) by one. If not, the count TVAD_X(n) will be reset to an initialization value VadXTimerInit. The output of the VAD timer block 509x, i.e., count TVAD_X(n), is passed on to a voice activity detection (VAD) block 510x where the count TVAD_X(n) is compared with a pre-determined threshold, e.g., zero. If the current count TVAD_X(n) is greater than the pre-determined threshold (zero), a flag VADX(n) will be set to '1', otherwise to '0'. VADX(n)=1 means here that a near end talker is active. VADX(n)=0 means that the near end talker is not active. VADY(n)=1 means here that a far end talker is active. VADY(n)=0 means that the far end talker is not active.

In the speech leveling system as partially shown in FIG. 5B, a gain control block 517 includes a speech root-mean-square (RMS) level determination block 518 which receives the output signal OutTfe(n), the flag VAD_Y(n), the flag VAD_X(n) and a previous sample of the smoothed RMS signal SRMS(n−1). The speech RMS level determination block 518 outputs a signal $In_{RMS}(n)$. The signal $In_{RMS}(n)$ is equal to the output signal OutTfe(n) if the flag VAD_X(n) is '0' and the flag VAD_Y(n) is '1', and is set to the value of the a previous sample of the smoothed RMS signal SRMS (n−1) otherwise. The signal $In_{RMS}(n)$ is subject to a subsequent maximum absolute value (MaxAbs) determination (calculation) optionally utilizing the initial root mean square (RMS) value RmsInit_dB. The value out of the MaxAbs determination is supplied to a smoothing block 519 which provides the smoothed RMS signal SRMS(n). The smoothed RMS signal SRMS(n) is, on the one hand, delayed by one sample to generate the previous sample of the smoothed RMS signal SRMS(n−1) which is fed back to the speech RMS level determination block 518, and, on the other hand, is supplied to a gain determination block 520 where a gain control signal Gain(n) is generated according to the ratio between a reference level RefLevel and the smoothed RMS signal SRMS(n).

In an optional gain limitation block 521, the gain control signal Gain(n) is compared to a reference value MaxVadGain. As a consequence, if the gain control signal Gain(n) is greater than the reference value MaxVadGain, the output signal of the gain limitation block 521, which is a limited gain control signal Gain'(n) and which can be considered an updated gain control signal Gain(n), is set to the reference voice activity value MaxVadGain, and otherwise to the gain control signal Gain(n). In the present example, the limited gain control signal Gain'(n) is supplied to a speech pause detection (SPD) gain limitation block 522 which further receives the flags VADY(n) and VADX(n) as well as a reference speech pause value MaxGain. If flag VADX(n) is '0' and flag VADY(n) is '1' at time n, a final gain control signal Gain"(n), which can be considered as updated gain control signal Gain'(n), is set to the reference value Max-Gain, and otherwise to the limited gain control signal Gain'(n). The final gain control signal Gain"(n) may optionally be smoothed over time by way of a smoothing filter block (not shown) before it controls a controllable gain block 523. Gain block 523 is supplied via an optional delay block 524 with the input signal OutTfe(n) and which outputs the output signal Out(n) which may be processed by an optional peak limiter 525 to provide the limited output signal OutL(n).

In the system shown in FIGS. 5A and 5B, two identical or different tuning sets may be used for the determination of the voice activity detection flags VADY(n) and VADX(n). However, both are based on spectral SNR values. For example, for the determination of the voice activity detection flag VADY(n), a higher value for the SNR threshold VadYSnrTH may be used than for the SNR threshold VadXSnrTH for the determination the voice activity detection flag VADX(n). This allows, on the one hand, to only set the voice activity detection flag VADY(n) accordingly if it is sure that speech is present at the far end, hence the application of a high threshold, and, on the other hand, to set the voice activity detection flag VADX(n) accordingly only if there is no speech. This may be achieved by setting the respective SNR threshold to a lower value such that even vague speech parts will result in a detected speech activity and, thus, avoid an erroneous setting of the voice activity detection flag VADX (n). Further, the numbers of spectral components (lines) that exceed the given signal-to-noise ratio thresholds VadYSnrTH and VadXSnrTH are determined (flags counted or added) and the consequential numbers YVAD(n) and XVAD(n) are compared to thresholds VADY_TH and VADY_TH, respectively. The consequential time varying voice activity detection flag VAD_Y(n) will be set to '0', if its initial timer value VadYTimerInit has expired, and the consequential time varying voice activity detection flag VAD_X(n) will be set to '0', if its initial timer value VadXTimerInit has expired.

If the time varying VAD flag VAD_Y(n) is ' 1', i.e. only in active speech sequences at the far end, and VAD_X(n) is "0", i.e. only in speech pause sequences at the near end, the RMS value or, alternatively, the maximum absolute peak value of the output signal OutTfe(n) will be determined. Otherwise, the previous sample of the smoothed speech RMS value SRMS(n−1) will be passed on to the smoothing filter 519. In order to avoid undesired transient effects, RMS determination may optionally be initialized with a properly chosen initialization value RmsInit_dB. As a smoothing filter, for example, an Infinite Impulse Response (IIR) low-pass filter with a relatively long smoothing time constant τ, may be used. The current gain value Gain(n) is determined (calculated) by taking the ratio of the desired reference RMS value of the speech output signal, i.e., reference level RefLevel or alternatively reference peak level RefPeakLevel, and the output signal of this smoothing filter, i.e., SRMS(n), so that Gain(n)=RefLevel/SRMS(n).

Further, an optional limitation of the maximum of the gain value Gain(n) to a value MaxVadGain may be applied, in order to avoid successive amplifications of very small input signals, as already described above. Thus, a gain value Gain'(n)=Gain(n) if Gain(n)<GainVadMax and Gain'(n) =MaxVadGain otherwise. Still another limitation of the gain value may optionally be applied, which may act as a level compensator in, e.g., hands-free applications and which may be controlled by the time varying voice activity detection flags $VAD_Y(n)$ and/or $VAD_X(n)$. Thereby the gain value Gain'(n) will be reduced to the given limit MaxGain if the voice activity detection flag $VAD_X(n)$ assumes '0' and the voice activity detection flag $VAD_Y(n)$ assumes '1'. Otherwise Gain"(n)=Gain'(n).

With the described system it is possible to securely sense speech pauses and as such to apply the needed gating to the gain value Gain(n). A major challenge is to leave this gating stage quick enough once speech (from the near end talker) is active again. If this is not guaranteed, it may happen that the first parts of the on-setting speech may not be amplified as desired and as such cannot be understood, neither by speech recognition systems, nor by human listeners (far-end talker). One way to avoid this is to use a quickly reacting voice activity detection and/or speech pause detection. This may be realized by using a non-smoothed, instantaneous RMS value which will be compared to the given threshold as part of the decision. If this is not sufficient, the input signal can optionally be delayed by one or several frames, before the current gain G is applied to it.

Figure 6A:
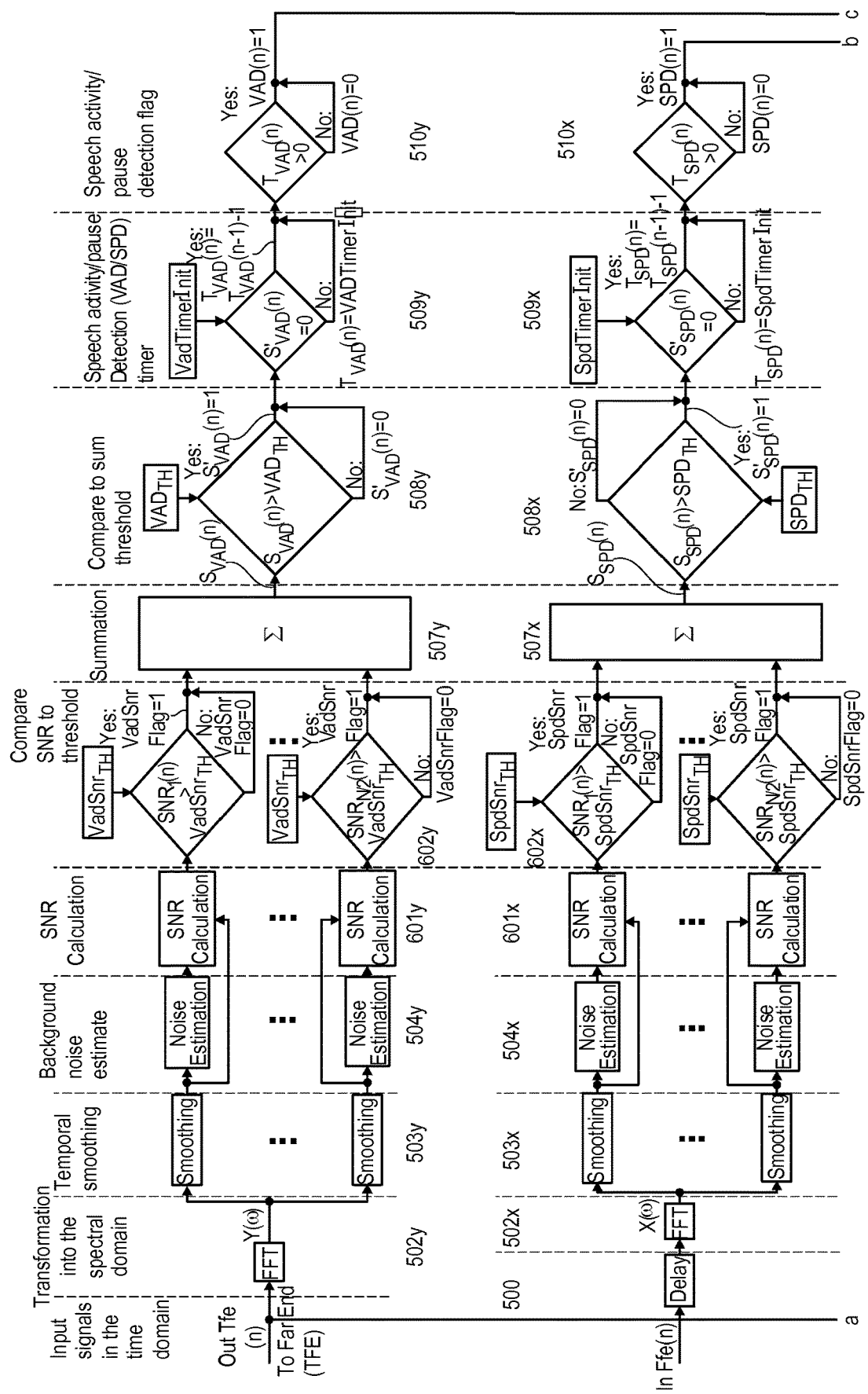
FIGS. 6A and 6B are detailed schematic diagrams illustrating a signal processing structure and signal flow of a modification of the speech leveling system shown in FIG. 4.
Figure 6B:
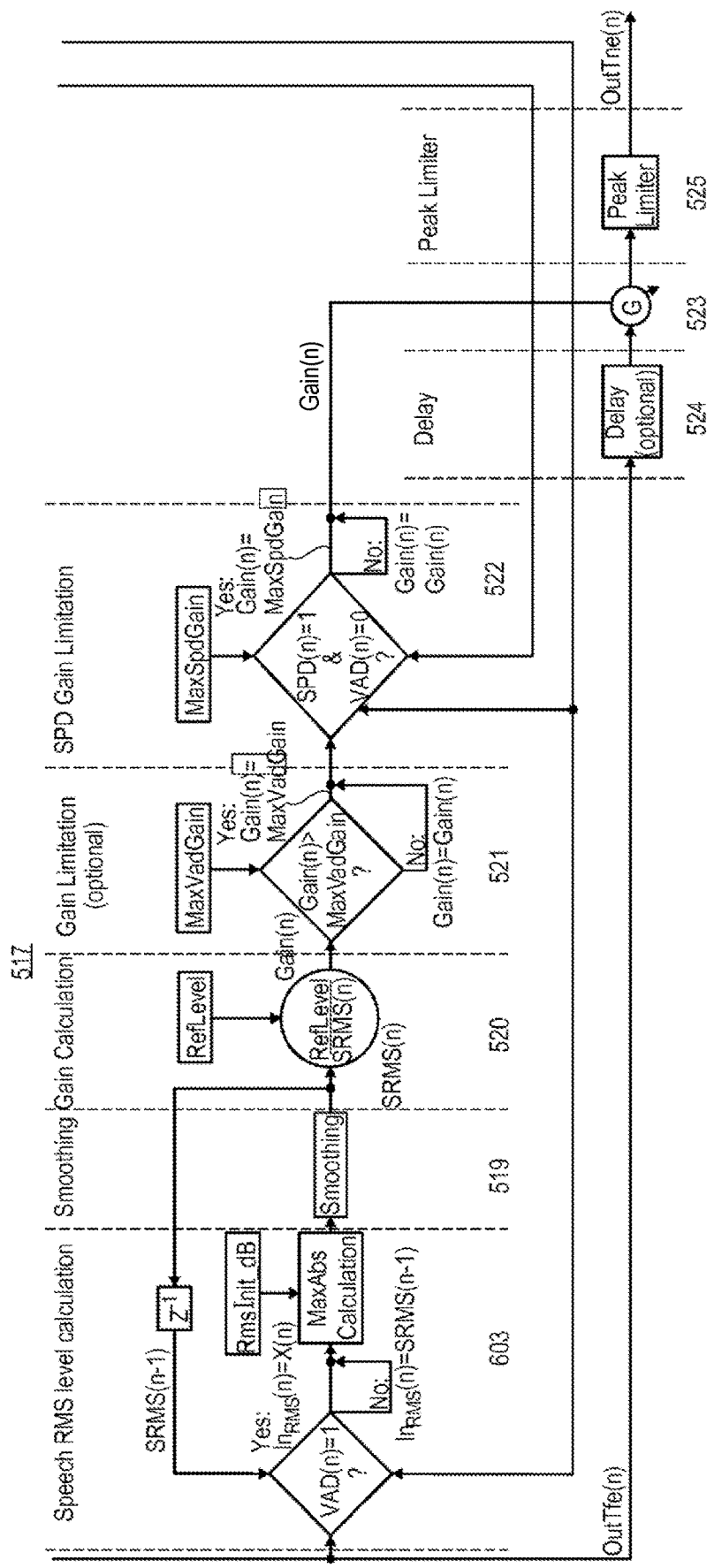

Referring now to FIGS. 6A and 6B, which is the system shown in and described in connection with FIGS. 5A and 5B with some modifications. As can be seen particularly from FIG. 6A, based on the smoothed signals from the multiplicity of temporal smoothing blocks 503y and 503x, and the estimated quasi stationary background noise signals from the multiplicity of noise estimation blocks 504y and 504x, the variations in the SNR can be determined (calculated), e.g., as frequency distribution of SNR values in corresponding subsequent SNR calculation blocks 601y and 601x. Using variations in the SNR, noise can be differentiated from a desired speech or music signal. For example, a low SNR value may be linked to a variety of noise sources such as an air-conditioner, fan, an open window, or an electrical device such as a computer etc. The SNR may be evaluated in the time domain or in the frequency domain or in the sub-band domain. In groups of comparator blocks 602y and 602x that substitute blocks 506y and 506x shown in FIG. 5A, output SNR values determined by the groups of SNR determination blocks 601y and 601x are compared to a pre-determined threshold, e.g., SNR thresholds VadSnrTH and SNR threshold SpdSnrTH, respectively.

If the determined current SNR values provided by blocks 601y are greater than the pre-determined threshold VadSnrTH, flags VadSnrFlag will be set to a first logic value, e.g., '1'. Otherwise, the flags VadSnrFlag will be set to a second logic value, e.g., '0'. The flags from the multiplicity of comparator blocks 602y are passed on to summation block 507y. The summation block 507y sums up the spectral flags VadSnrFlag from the multiplicity of comparator blocks 602y and outputs a time varying sum signal SVAD(n). The sum signal SVAD(n) is passed to comparator block 508y where the sum signal SVAD(n) is compared to a pre-determined sum threshold VADTH. If the current value of the sum signal SVAD(n) is greater than the pre-determined sum threshold VADTH, a flag S'VAD(n), which can be considered an updated sum signal SVAD(n), will be set to a first logic state, e.g., '1'. Otherwise the flag S'VAD(n) will be set to another logical state, e.g., '0'. The blocks 509y and 510y are operated as shown in FIG. 5A with VadYTimerInit=VadTimerInit, VAD_Y(n)=SVAD(n), TVAD Y=TVAD and VADY(n)=VAD(n).

If the determined current SNR values provided by blocks 601x are greater than the pre-determined threshold $SpdSnr_{TH}$, flags SpdSnrFlag will be set to a first logic value, e.g., '1'. Otherwise, the flags SpdSnrFlag will be set to a second logic value, e.g., '0'. The flags from the multiplicity of comparator blocks 602x are passed on to summation block 507x. The summation block 507x sums up the spectral flags SpdSnrFlag from the multiplicity of comparator blocks 602x and outputs a time varying sum signal $S_{SPD}(n)$. The sum signal $S_{SPD}(n)$ is passed to comparator block 508x where the sum signal $S_{SPD}(n)$ is compared to a pre-determined sum threshold $SPD_{TH}$. If the current value of the sum signal $S_{SPD}(n)$ is greater than the pre-determined sum threshold $SPD_{TH}$, a flag $S'_{SPD}(n)$, which can be considered an updated sum signal $S_{SPD}(n)$, will be set to a first logic state, e.g., ' 1' (one). Otherwise the flag $S'_{SPD}(n)$ will be set to another logical state, e.g., '0' (zero). The blocks 509x and 510x are operated as shown in FIG. 5 with $Vad_X$Timerinit=SpdTimerinit, $VAD\_X(n)=S_{SPD}(n)$, $T_{VAD\_X}=T_{SPD}$ and $VAD_X(n)=SPD(n)$.

Referring particularly to FIG. 6B, block 518 shown in FIG. 5B may be modified to substitute block 518 by a block 603 in which the flag VAD(n) is compared with 1, and if it is equal to 1, InRMS(n) is set to OutTfe(n). Otherwise InRMS(n) is set to SRMS(n−1). As for the rest blocks 518 and 603 are identical. Blocks 519-525 are connected downstream of block 603 in the manner shown in FIG. 5B in connection with block 518, wherein VADX(n)=SPD(n) and VADY(n)=VAD(n).

Figure 7A:
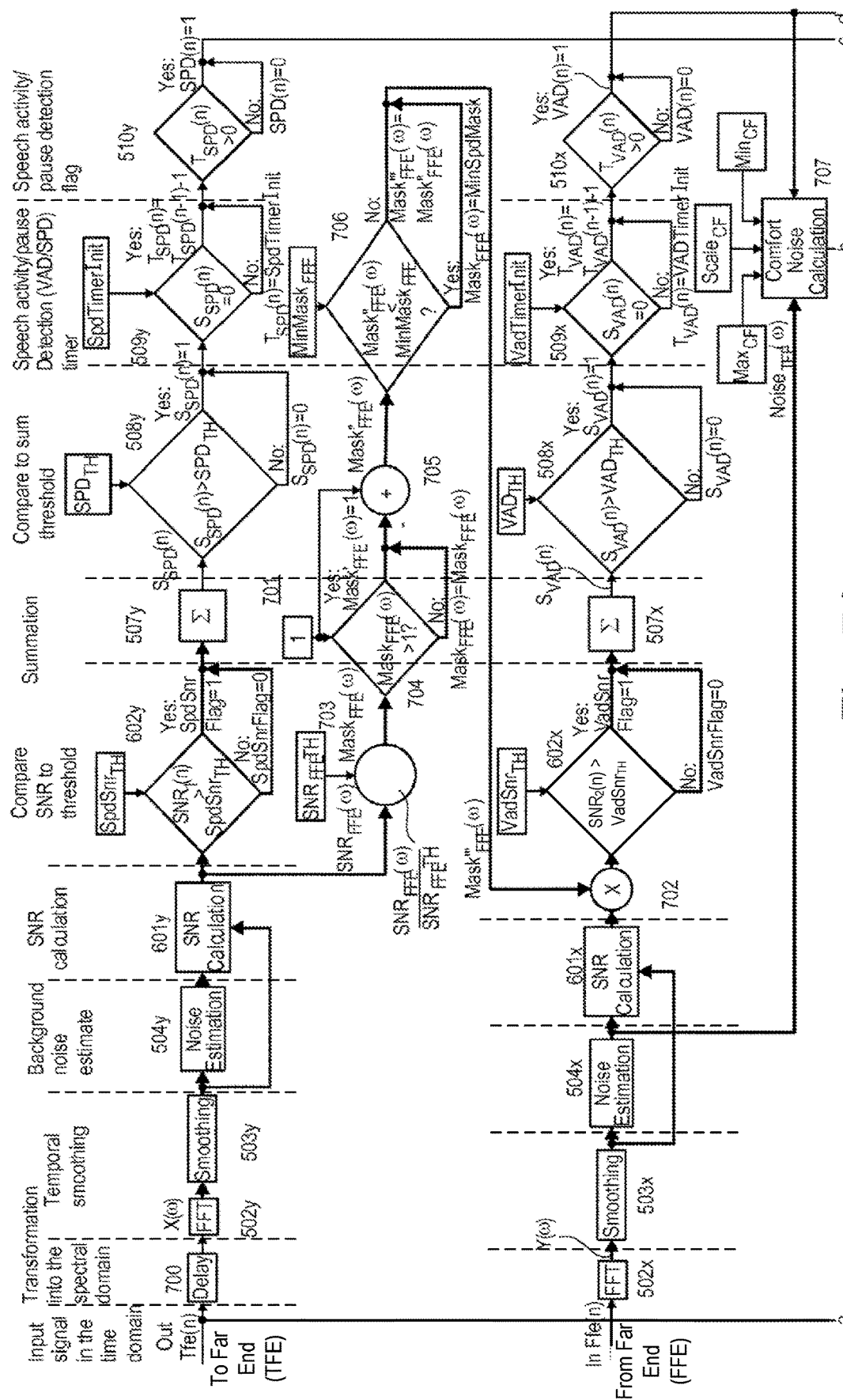
FIGS. 7A and 7B are detailed schematic diagrams illustrating a signal processing structure and signal flow of another modification of the speech leveling system shown in FIG. 4.
Figure 7B:
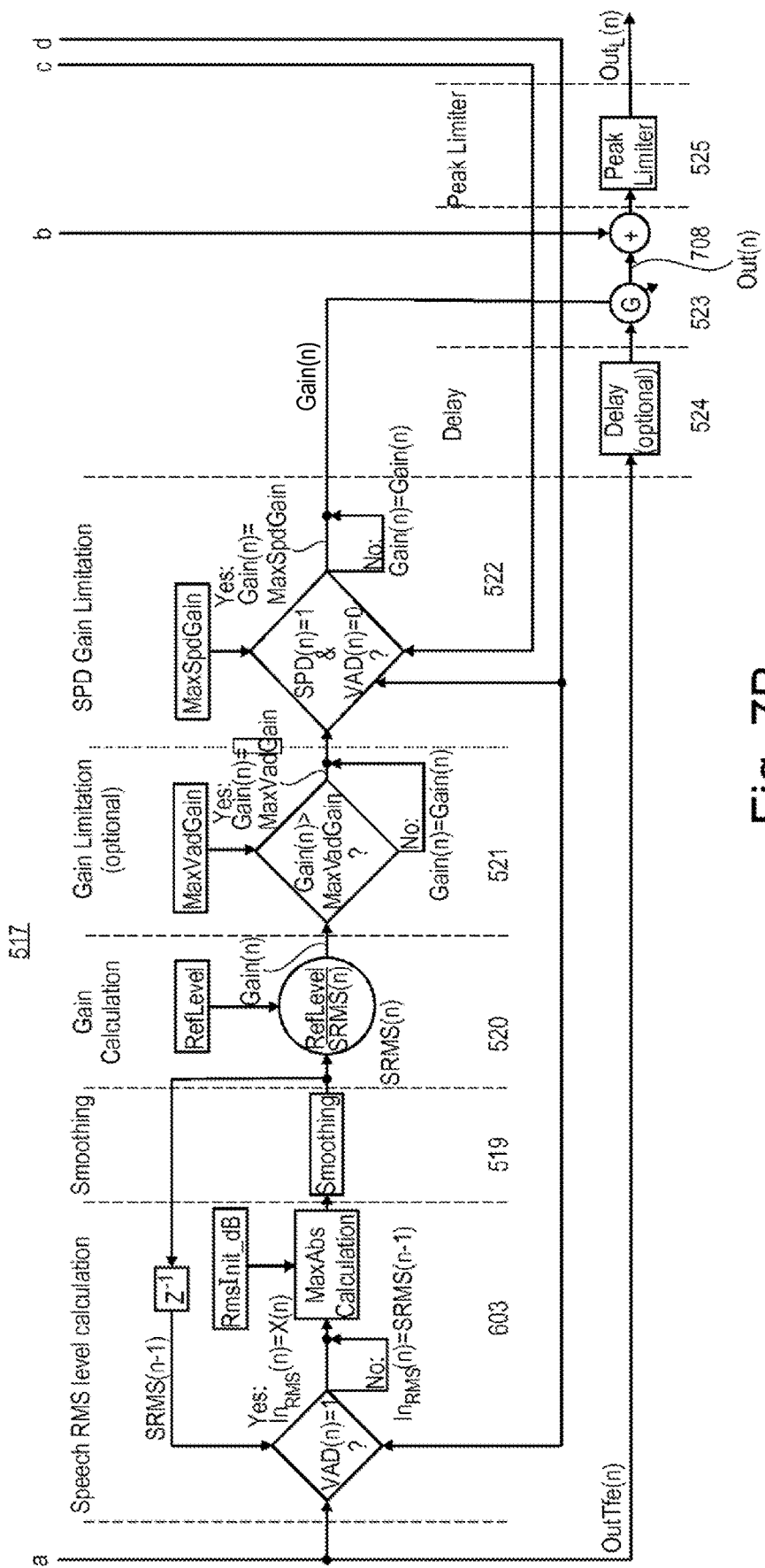

FIGS. 7A and 7B illustrate the system shown in and described in connection with FIGS. 6A and 6B with some modifications, wherein separate frequency signal channels are displayed as one multi-signal channel connection depicted as a bold line. As can be seen particularly from FIG. 7A, a delay block 700 providing a temporal signal delay has been added upstream of the time-frequency transformation block 502y while delay block 500 shown in FIG. 5B is omitted. Further, a multi-channel signal path 701 has been added extending from the outputs of SNR calculation blocks 601x to a multiplier block 702. The multi-channel signal path 701 includes a multi-channel divider block 703 that receives the signal-to-noise ratios SNRFFE(ω) per frequency of the signal received from the far end InFfe(n) and divides these signal-to-noise ratios SNRFFE(ω) by an SNR threshold SNRFFETH to provide a multi-channel masking signal MaskFFE(ω). These masking signals MaskFFE(ω) are compared to 1 in a multi-channel comparison block 704 which sets masking signals MaskFFE'(ω) to 1 if respective masking signals MaskFFE(ω) are greater than 1 and otherwise to the respective masking signals MaskFFE(ω). The masking signals MaskFFE'(ω) is then increased by 1 in a multi-channel adder block 705 to provide a multi-channel masking signal MaskFFE"(ω). The multi-channel masking signal MaskFFE"(ω) is compared to a minimum masking threshold MinMaskFFE in a multi-channel comparator block 706 which outputs a multi-channel masking signal MaskFFE"(ω). The multi-channel masking signal MaskFFE"(ω), which is supplied to the multi-channel multiplier block 702, is per frequency a fixed value MindSpdMask if the multi-channel masking signal MaskFFE"(ω) the respective masking signal MaskFFE"(ω) is greater than a minimum masking threshold MinMaskFFE, or otherwise the masking signal MaskFFE"(ω).

Further, a multi-channel comfort noise generation (e.g., calculation) block 707 has been added to the system. Multi-channel comfort noise generation (e.g., calculation) block 707 receives a multi-channel estimated noise signal NoiseTFE(ω) from the noise estimation blocks 504y and the flags VAD(n) from block 510y. Further, comfort noise generation block 707 receives a minimum noise threshold MINCF, a maximum noise threshold MAXCF and scaling factor ScaleCF. Referring to FIG. 7B, the comfort noise generation block 707 generates a noise signal b that is added to the output signal Out, e.g., by an adder block 708 inserted between controllable gain block 523 and optional limiter block 525. Comfort noise generation block 707 generates a more pleasant or natural noise to be presented to a listener.

The description of embodiments has been presented for purposes of illustration and description. Suitable modifications and variations to the embodiments may be performed in light of the above description or may be acquired from practicing the methods. For example, unless otherwise noted, one or more of the described methods may be performed by a suitable device and/or combination of devices. The described methods and associated actions may also be performed in various orders in addition to the order described in this application, in parallel, and/or simultaneously. The described systems are exemplary in nature, and may include additional elements and/or omit elements.

As used in this application, an element or step recited in the singular and proceeded with the word "a" or "an" should be understood as not excluding plural of said elements or steps, unless such exclusion is stated. Furthermore, references to "one embodiment" or "one example" of the present disclosure are not intended to be interpreted as excluding the existence of additional embodiments that also incorporate the recited features. The terms "first," "second," and "third," etc. are used merely as labels, and are not intended to impose numerical requirements or a particular positional order on their objects.

The embodiments of the present disclosure generally provide for a plurality of circuits, electrical devices, and/or at least one controller. All references to the circuits, the at least one controller, and other electrical devices and the functionality provided by each, are not intended to be limited to encompassing only what is illustrated and described herein. While particular labels may be assigned to the various circuit(s), controller(s) and other electrical devices disclosed, such labels are not intended to limit the scope of operation for the various circuit(s), controller(s) and other electrical devices. Such circuit(s), controller(s) and other electrical devices may be combined with each other and/or separated in any manner based on the particular type of electrical implementation that is desired.

It is recognized that any controller or signal processor may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof) and software which co-act with one another to perform operation(s) disclosed herein. In addition, any controller or signal processor utilizes any one or more microprocessors to execute a computer-program that is embodied in a non-transitory computer readable medium that is programmed to perform any number of the functions as disclosed. Further, any controller as provided herein includes a housing and the various number of microprocessors, integrated circuits, and memory devices ((e.g., FLASH, random access memory (RAM), read only memory (ROM), electrically programmable read only memory (EPROM), electrically erasable programmable read only memory (EEPROM)) positioned within the housing. The controller(s) as disclosed also include hardware based inputs and outputs for receiving and transmitting data, respectively from and to other hardware based devices as discussed herein.

While various embodiments of the invention have been described, it will be apparent to those of ordinary skilled in the art that many more embodiments and implementations are possible within the scope of the invention. In particular, the skilled person will recognize the interchangeability of various features from different embodiments. Although these techniques and systems have been disclosed in the context of certain embodiments and examples, it will be understood that these techniques and systems may be extended beyond the specifically disclosed embodiments to other embodiments and/or uses and obvious modifications thereof.

The invention claimed is:

1. A speech signal leveling system comprising:
   a controllable-gain block configured to receive an input signal and to generate an output signal by applying a frequency-dependent or frequency-independent controllable gain to the input signal, the gain being dependent on a gain control signal;
   a speech detecting block configured to receive the input signal and to generate at least one speech detection signal indicative of voice components contained in the input signal; and
   a gain control block operatively coupled with the controllable-gain block and the speech detecting block, the gain control block configured to receive the input signal and the at least one speech detection signal, and to generate the gain control signal based on the input signal and the at least one speech detection signal; wherein the gain control block is further configured to control the controllable-gain block to amplify or attenuate the input signal to have a predetermined mean or maximum or absolute peak signal level as long as voice components are detected in the input signal, the speech signal leveling system is configured so that a time for transferring the input signal to the controllable-gain block is equal to a time for processing the gain control signal from the input signal in the speech detecting block and the gain control block.

2. The system of claim 1, wherein
   the speech detecting block is further configured to generate at least one of a voice activity detection signal indicative of voice components contained in the input signal and a speech pause detection signal indicative of speech pauses occurring in the input signal; and
   the gain control block is further configured to generate the gain control signal based on at least one of the voice activity detection signal and the speech pause detection signal.

3. The system of claim 2, wherein the speech detecting block is further configured to:
   determine from the input signal at least two signal-to-noise ratios for at least two frequency bands of the input signal;
   compare the at least two signal-to-noise ratios to a signal-to-noise ratio threshold for voice activity detection and to a signal-to-noise ratio threshold for speech pause detection;
   provide first signals indicative of whether the at least two signal-to-noise ratios are greater than the signal-to-noise ratio threshold for voice activity detection, and second signals indicative of whether the at least one signal-to-noise ratio is greater than the signal-to-noise ratio threshold for speech pause detection;
   sum up the first signals to provide a first sum signal and to sum up the second signals to provide a second sum signal; and
   the signal-to-noise ratio threshold for voice activity detection is greater than the signal-to-noise ratio threshold for speech pause detection.

4. The system of claim 3, wherein the speech detecting block is further configured to:
   determine a root mean square value or a maximum absolute peak value of the input signal;
   compare the root mean square value of the input signal to a root mean square threshold or the maximum absolute peak value to a maximum absolute peak threshold; and
   compare at least one of the first sum signal to a voice activity detection threshold and the second sum signal to speech pause detection threshold; wherein the speech detecting block is further configured to at least one of:
   provide an updated first sum signal which represents a first logical state if the first sum signal exceeds the voice activity detection threshold and the root mean square value exceeds the root mean square threshold or the maximum absolute peak value exceeds the maximum absolute peak threshold, and provide an updated first sum signal which represents a second logical state otherwise; and
   provide an updated second sum signal which represents a first logical state if the second sum signal exceeds the speech pause detection threshold and the root mean square value exceeds the root mean square threshold or the maximum absolute peak value exceeds the maximum absolute peak threshold, and provide an updated second sum signal which represents a second logical state otherwise.

5. The system of claim 1, wherein the gain control block is further configured to:
   determine a mean signal indicative of a root mean square of the input signal, smooth the mean signal with a filter to provide a smoothed mean signal; and take the ratio between a reference mean level and the smoothed mean signal to provide the gain control signal; or
   determine a maximum absolute peak signal indicative of a maximum absolute peak value of the input signal, smooth the maximum absolute peak signal with a filter to provide a smoothed maximum absolute peak signal; and take the ratio between a reference maximum absolute peak level and the smoothed maximum absolute peak signal to provide the gain control signal.

6. The system of claim 1, wherein the gain control block is further configured to at least one of:
   control the gain of the controllable-gain block to be at or below a predetermined first gain threshold; and
   control the gain of the controllable-gain block to be at or below a second gain threshold that is dependent on the at least one speech detection signal; and
   control the gain of the controllable-gain block to block the input signal so that no-output signal is provided as long as no voice components are detected in the input signal.

7. A speech signal leveling method comprising:
   generating an output signal in a controllable-gain block by applying a frequency-dependent or frequency-independent, controllable gain to an input signal, the gain being dependent on a gain control signal;
   generating, in a speech-detection block, at least one speech detection signal indicative of voice components contained in the input signal;
   generating the gain control signal based the input signal and the at least one speech detection signal, a time for transferring the input signal to the controllable-gain block is equal to a time for processing the gain control signal from the input signal in the speech detecting block and the gain control block; and controlling the controllable-gain block to amplify or attenuate the input signal to have a predetermined mean or maximum or absolute peak signal level as long as voice components are detected in the input signal.

8. The method of claim 7, further comprising:

generating at least one of a voice activity detection signal indicative of voice components contained in the input signal and a speech pause detection signal indicative of speech pauses occurring in the input signal; and generating the gain control signal based on the voice activity detection signal and the speech pause detection signal.

9. The method of claim 8, wherein generating at least one speech detection signal indicative of voice components contained in the input signal comprises:

determining from the input signal at least two signal-to-noise ratios for at least two frequency bands of the input signal;

comparing the at least two signal-to-noise ratios to a signal-to-noise ratio threshold for voice activity detection and to a signal-to-noise ratio threshold for speech pause detection;

providing first signals indicative of whether the at least two signal-to-noise ratios are greater than the signal-to-noise ratio threshold for voice activity detection, and second signals indicative of whether the at least one signal-to-noise ratio is greater than the signal-to-noise ratio threshold for speech pause detection;

summing up the first signals to provide a first sum signal and to sum up the second signals to provide a second sum signal; and the signal-to-noise ratio threshold for voice activity detection is greater than the signal-to-noise ratio threshold for speech pause detection.

10. The method of claim 9, generating at least one speech detection signal indicative of voice components contained in the input signal further comprises:

determining a root mean square value or a maximum absolute peak value of the input signal;

comparing the root mean square value of the input signal to a root mean square threshold or the maximum absolute peak value to a maximum absolute peak threshold;

comparing at least one of the first sum signal to a voice activity detection threshold and the second sum signal to speech pause detection threshold; wherein generating at least one speech detection signal further comprises at least one of:

providing an updated first sum signal which represents a first logical state if the first sum signal exceeds the voice activity detection threshold and the root mean square value exceeds the root mean square threshold or the maximum absolute peak value exceeds the maximum absolute peak threshold, and providing an updated first sum signal which represents a second logical state otherwise; and providing an updated second sum signal which represents a first logical state if the second sum signal exceeds the speech pause detection threshold and the root mean square value exceeds the root mean square threshold or the maximum absolute peak value exceeds the maximum absolute peak threshold, and providing an updated second sum signal which represents a second logical state otherwise.

11. The method of claim 7, wherein generating the gain control signal further comprises:

determining a mean signal indicative of the root mean square of the input signal; smoothing the mean signal with a filter to provide a smoothed mean signal; and taking the ratio between a reference mean level and the smoothed mean signal to provide the gain control signal, or determining a maximum absolute peak signal indicative of a maximum absolute peak value of the input signal, smoothing the maximum absolute peak signal with a filter to provide a smoothed maximum absolute peak signal; and taking the ratio between a reference maximum absolute peak level and the smoothed maximum absolute peak signal to provide the gain control signal.

12. The method of claim 7, wherein generating the gain control signal comprises at least one of:

controlling the gain of the controllable-gain block to be at or below a predetermined first gain threshold;

controlling the gain of the controllable-gain block to be at or below a second gain threshold that is dependent on the at least one speech detection signal; and controlling the gain of the controllable-gain block to block the input signal so that no output signal is provided as long as no voice components are detected in the input signal.

13. A computer program embodied in a non-transitory computer readable medium, comprising instructions which, when executed by a computer cause the computer to carry out the steps of:

generating, in a controllable gain-block, an output signal by applying a frequency-dependent or frequency-independent, controllable gain to an input signal, the gain being dependent on a gain control signal;

generating, in a speech-detection block, at least one speech detection signal indicative of voice components contained in the input signal;

generating the gain control signal based on the input signal and the at least one speech detection signal, controlling the controllable-gain block to amplify or attenuate the input signal to have a predetermined mean or maximum or absolute peak signal level as long as voice components are detected in the input;

generating at least one of a voice activity detection signal indicative of voice components contained in the input signal and a speech pause detection signal indicative of speech pauses occurring in the input signal; and generating the gain control signal based on the voice activity detection signal and the speech pause detection signal, a time for transferring the input signal to the controllable-gain block is equal to a time for processing the gain control signal from the input signal in the speech detecting block and the gain control block.

14. The computer program of claim 13, wherein generating at least one speech detection signal indicative of voice components contained in the input signal comprises:

determining from the input signal at least two signal-to-noise ratios for at least two frequency bands of the input signal;

comparing the at least two signal-to-noise ratios to a signal-to-noise ratio threshold for voice activity detection and to a signal-to-noise ratio threshold for speech pause detection;

providing first signals indicative of whether the at least two signal-to-noise ratios are greater than the signal-to-noise ratio threshold for voice activity detection, and second signals indicative of whether the at least one signal-to-noise ratio is greater than the signal-to-noise ratio threshold for speech pause detection;

summing up the first signals to provide a first sum signal and to sum up the second signals to provide a second sum signal; and the signal-to-noise ratio threshold for voice activity detection is greater than the signal-to-noise ratio threshold for speech pause detection.

15. The computer program of claim 14, wherein generating at least one speech detection signal indicative of voice components contained in the input signal further comprises:

determining a root mean square value or a maximum absolute peak value of the input signal;

comparing the root mean square value of the input signal to a root mean square threshold or the maximum absolute peak value to a maximum absolute peak threshold;

comparing at least one of the first sum signal to a voice activity detection threshold and the second sum signal to speech pause detection threshold; wherein generating at least one speech detection signal further comprises at least one of:

providing an updated first sum signal which represents a first logical state if the first sum signal exceeds the voice activity detection threshold and the root mean square value exceeds the root mean square threshold or the maximum absolute peak value exceeds the maximum absolute peak threshold, and providing an updated first sum signal which represents a second logical state otherwise; and providing an updated second sum signal which represents a first logical state if the second sum signal exceeds the speech pause detection threshold and the root mean square value exceeds the root mean square threshold or the maximum absolute peak value exceeds the maximum absolute peak threshold, and providing an updated second sum signal which represents a second logical state otherwise.

16. The computer program of claim 13, wherein generating the gain control signal further comprises:

determining a mean signal indicative of the root mean square of the input signal; smoothing the mean signal with a filter to provide a smoothed mean signal; and taking the ratio between a reference mean level and the smoothed mean signal to provide the gain control signal, or determining a maximum absolute peak signal indicative of a maximum absolute peak value of the input signal, smoothing the maximum absolute peak signal with a filter to provide a smoothed maximum absolute peak signal; and taking the ratio between a reference maximum absolute peak level and the smoothed maximum absolute peak signal to provide the gain control signal.

17. The computer program of claim 13, wherein generating the gain control signal comprises at least one of:

controlling the gain of the controllable-gain block to be at or below a predetermined first gain threshold;

controlling the gain of the controllable-gain block to be at or below a second gain threshold that is dependent on the at least one speech detection signal; and controlling the gain of the controllable-gain block to block the input signal so that no output signal is provided as long as no voice components are detected in the input signal.

* * * * *